(12) United States Patent
Kawai et al.

(10) Patent No.: US 9,209,224 B2
(45) Date of Patent: Dec. 8, 2015

(54) SEMICONDUCTOR LIGHT-EMITTING DEVICE

(71) Applicant: STANLEY ELECTRIC CO., LTD., Meguro-ku, Tokyo (JP)

(72) Inventors: Ryosuke Kawai, Yokohama (JP); Tatsuma Saito, Yokohama (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 14/594,807

(22) Filed: Jan. 12, 2015

(65) Prior Publication Data

US 2015/0206922 A1 Jul. 23, 2015

(30) Foreign Application Priority Data

Jan. 17, 2014 (JP) ................... 2014-007001

(51) Int. Cl.

| | |
|---|---|
| H01L 27/15 | (2006.01) |
| H01L 33/38 | (2010.01) |
| H01L 33/08 | (2010.01) |
| H01L 25/075 | (2006.01) |
| H01L 33/62 | (2010.01) |
| H01L 51/52 | (2006.01) |
| H05B 33/08 | (2006.01) |
| H01L 33/40 | (2010.01) |
| H01L 33/44 | (2010.01) |

(52) U.S. Cl.
CPC ............ *H01L 27/15* (2013.01); *H01L 25/0753* (2013.01); *H01L 33/08* (2013.01); *H01L 33/387* (2013.01); *H01L 33/62* (2013.01); *H01L 33/382* (2013.01); *H01L 33/40* (2013.01); *H01L 33/44* (2013.01); *H01L 51/5284* (2013.01); *H01L 2924/0002* (2013.01); *H01L 2924/12041* (2013.01); *H05B 33/0803* (2013.01)

(58) Field of Classification Search
CPC ..... H01L 33/382; H01L 33/387; H01L 33/08; H01L 33/62; H01L 2924/12041; H01L 51/5284; H05K 2201/10106; H05B 33/0803
See application file for complete search history.

(56) References Cited

U.S. PATENT DOCUMENTS

| | | | |
|---|---|---|---|
| 2012/0126259 A1* | 5/2012 | Mizutani et al. | ................ 257/88 |
| 2014/0014990 A1 | 1/2014 | Kim et al. | |
| 2014/0175471 A1 | 6/2014 | Akimoto et al. | |
| 2014/0191258 A1 | 7/2014 | Akimoto et al. | |
| 2014/0239341 A1* | 8/2014 | Matsumura | .................... 257/99 |

FOREIGN PATENT DOCUMENTS

| | | |
|---|---|---|
| JP | 2013065726 A | 4/2013 |
| WO | 2013021519 A1 | 2/2013 |
| WO | 2013154818 A1 | 10/2013 |

OTHER PUBLICATIONS

Extended European Search Report dated Apr. 30, 2015, issued in counterpart European Application No. 15151383.5.

* cited by examiner

*Primary Examiner* — Armando Rodriguez
(74) *Attorney, Agent, or Firm* — Holtz, Holtz, Goodman & Chick PC

(57) ABSTRACT

A semiconductor light-emitting device comprises: a mounting substrate; a plurality of semiconductor light-emitting elements that are arranged on the mounting substrate; a light absorber that is formed so as to cover an entire region between the plurality of semiconductor light-emitting elements adjacent to each other on the mounting substrate; and a wiring group including a plurality of wirings wired to each of the plurality of semiconductor light-emitting elements.

4 Claims, 4 Drawing Sheets

SEMICONDUCTOR LIGHT-EMITTING DEVICE

BACKGROUND OF THE INVENTION

1. Field of the Invention

The present invention relates to a semiconductor light-emitting device including a plurality of semiconductor light-emitting elements such as light-emitting diodes (LEDs).

2. Background Art

Semiconductor light-emitting elements are generally fabricated by the following steps. First, a semiconductor structure layer made up of an n-type semiconductor layer, a light-emitting layer, and a p-type semiconductor layer are grown on a growth substrate, and then an n-electrode and a p-electrode that respectively apply voltage to the n-type semiconductor layer and the p-type semiconductor layer are formed. As semiconductor light-emitting elements with enhanced heat dissipation performance, there is known a semiconductor light-emitting element formed by bonding a semiconductor structure layer on a growth substrate to a support substrate other than the growth substrate and then removing the growth substrate. Semiconductor light-emitting devices are fabricated by fixing a plurality of semiconductor light-emitting elements onto a mounting substrate, forming a fluorescence layer for wavelength conversion, and then encapsulating an entire body with resin and the like. Japanese Patent Application Laid-Open No. 2013-065726 discloses a semiconductor light-emitting device having a plurality of chips on a package structure, the chips being partially connected in parallel.

SUMMARY OF THE INVENTION

In recent years, in the field of headlights for automobile, much focus is being placed on a technology to perform real-time control on a light distribution pattern in response to situations ahead, i.e., the presence and position of an oncoming vehicle, a preceding vehicle, and the like. By using this technology, when an oncoming vehicle is detected while a driver is driving with a light distribution pattern for driving, i.e., with a high beam for example, only an area of the oncoming vehicle, among the area irradiated with the headlight, can be shaded in real time. This makes it possible to constantly provide a driver with visibility close to the visibility under the high beam, while protecting the driver of the oncoming vehicle from dazzling light (glare). Such a variable light distribution headlight system can be implemented by, for example, fabricating a semiconductor light-emitting device including a plurality of semiconductor light-emitting elements arranged in an array form, and controlling conduction and non-conduction of each of the semiconductor light-emitting elements in real time.

However, in general semiconductor light-emitting devices including a plurality of semiconductor light-emitting elements arranged, part of light emitted from a conducting element (i.e., a light emitting element) is sometimes transmitted to a non-conducting element (i.e., a non-light emitting element). In this case, weak light may be emitted from the non-conducting element, which may cause an unintended area to be irradiated with the light. For example, when a person is present in this unintended area, the light emitted to this area may cause glare. The so-called optical crosstalk problem further causes an ambiguous boundary between areas irradiated and not irradiated by the light-emitting device, and also causes failure in obtaining desired light distribution pattern. In various application fields of the light-emitting device including a plurality of elements, it is desirable to eliminate the optical crosstalk.

The present invention has been made in view of the above-described matters, and an object of the present invention is to provide a semiconductor light-emitting device having high performance and high luminous efficiency wherein optical crosstalk with the outside of an element region is substantially suppressed.

A semiconductor light-emitting device according to the present invention includes: a mounting substrate; a plurality of semiconductor light-emitting elements arranged on the mounting substrate, each of the plurality of semiconductor light-emitting elements including: a semiconductor structure layer configured to have a first semiconductor layer having a first conductivity type, a light-emitting layer, and a second semiconductor layer having a second conductivity type, which are stacked in order on the mounting substrate; a first electrode formed on the first semiconductor layer; and a second electrode extending through the first semiconductor layer and the light-emitting layer from a surface of the first semiconductor layer and being connected to the second semiconductor layer; a light absorber that is formed so as to cover an entire region between the plurality of semiconductor light-emitting elements adjacent to each other on the mounting substrate; and a wiring group including a plurality of wirings wired to each of the first electrodes between the mounting substrate and each of the plurality of semiconductor light-emitting elements, wherein the light absorber has conductivity and is electrically connected to each of the second electrodes between the mounting substrate and each of the plurality of semiconductor light-emitting elements, and the light absorber and the wiring group are formed between the mounting substrate and each of the plurality of semiconductor light-emitting elements so as to three-dimensionally overlap with each other via an insulating layer.

DETAILED DESCRIPTION OF THE INVENTION

Hereinbelow, the embodiment of the present invention will be described in detail.

First Embodiment

Figure 1A:
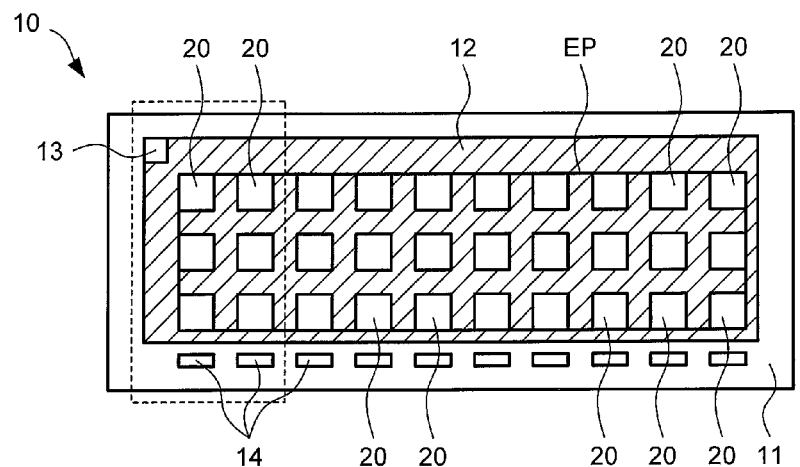
FIGS. 1A and 1B are schematic views illustrating an upper surface of a semiconductor light-emitting device in a first embodiment.
Figure 1B:
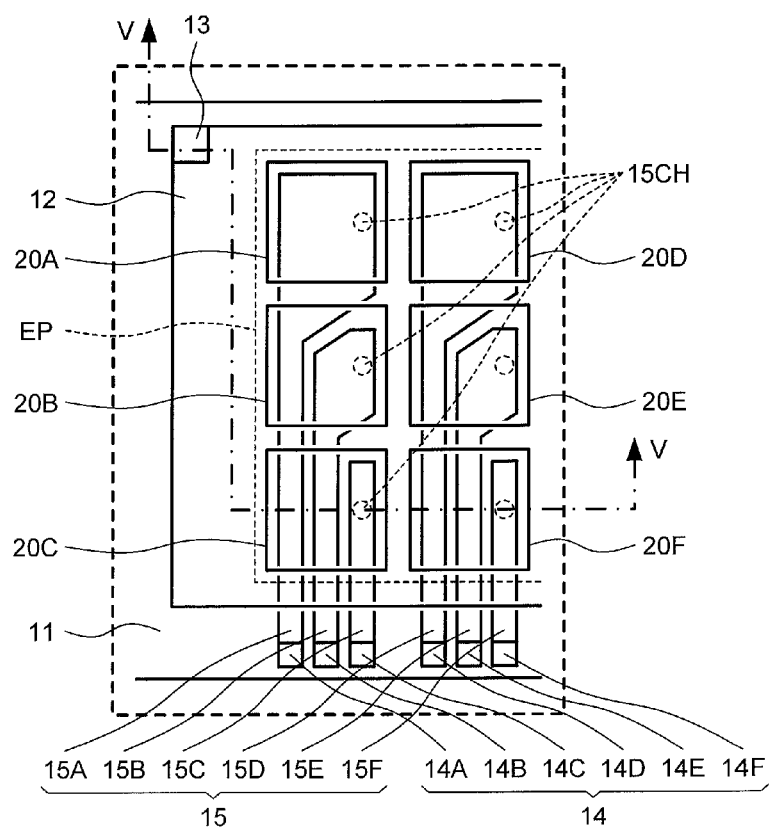

FIG. 1A is a schematic view illustrating an upper surface of a semiconductor light-emitting device 10 in the first embodiment. FIG. 1B is a partially enlarged schematic view illustrating a portion of FIG. 1A encircled with a broken line. The semiconductor light-emitting device 10 is configured to have a plurality of semiconductor light-emitting elements 20 (which may hereinbelow simply be referred to as elements)

arranged on a mounting substrate 11. The respective semiconductor light-emitting elements 20 arranged side by side are each arrayed at equal intervals. The plurality of semiconductor light-emitting elements 20 (which may hereinbelow be referred to as an element group) constitute as a whole a light-emitting portion EP of the semiconductor light-emitting device 10.

In the present embodiment, as viewed in a direction vertical to the mounting substrate 11, i.e., as viewed from the top, thirty semiconductor light-emitting elements 20 having a rectangular shape are arranged side by side in an array form made up of 3 rows and 10 columns on the mounting substrate 11. The light-emitting portion EP is classified into an element region (a portion of the elements 20 in FIG. 1A) and an inter-element region (a hatching region between the respective elements 20 in FIG. 1A) as viewed from the top. An outer edge of the light-emitting portion EP as viewed from the top matches a side surface portion of an outermost element 20, among the elements arranged in parallel on the mounting substrate 11, the side surface portion being the portion not facing other elements 20. Or the outer edge of the light-emitting portion EP is positioned outside the side surface portion, i.e., outside the element region. In actuality, the outer edge of the light-emitting portion EP as viewed from the top often spreads outside the element region. The respective elements 20 are similar in configuration and have a rectangular shape when viewed from the top.

As illustrated in FIG. 1A, the semiconductor light-emitting device 10 has a light absorber 12 formed so as to cover the entire region (which may hereinafter be referred to as the inter-element region) between the adjacent semiconductor light-emitting elements 20 on the mounting substrate 11. The light absorber 12 is constituted by a material having a high absorptivity with respect to emitted light from the semiconductor light-emitting element 20, i.e., a material having a low reflectance. Examples of the material of the light absorber 12 may include metal materials such as Ti, Pt, Au, Fe, W, Co, and Zn, semiconductor materials such as Si and C, and organic materials such as polyimide. In the present embodiment, the light absorber 12 has conductivity. For example, the light absorber 12 is made of Ti, Pt, or Au which is a metal material, and is formed like a film (in a layer shape) on the mounting substrate 11. The light absorber 12 is connected to each of the elements 20 between the mounting substrate 11 and the elements 20, and functions as a cathode line of the semiconductor light-emitting device 10. On the mounting substrate 11, an n-side pad electrode 13 and a p-side pad electrode group 14 comprised of a plurality of p-side pad electrodes are provided as a feed terminal to each of the elements. The respective pad electrodes are connected to an external power source (not illustrated) by wire bonding.

FIG. 1B is a partially enlarged schematic view illustrating a portion of FIG. 1A encircled with a broken line. In FIG. 1B, six semiconductor light-emitting elements 20 are identified as semiconductor light-emitting elements 20A, 20B, 20C, 20D, 20E, and 20F for facilitating understanding. FIG. 1B illustrates the case where the outer edge of the light-emitting portion EP is outside the element region. A wiring group 15 comprised of a plurality of wirings 15A, 15B, 15C, 15D, 15E, and 15F wired to the respective elements is provided between the mounting substrate 11 and the elements 20A, 20B, 20C, 20D, 20E, and 20F. Each of the wirings 15A to 15F is connected to each of the elements 20 through a contact hole 15CH between the mounting substrate 11 and the elements 20. The wiring group 15 functions as an anode line of the semiconductor light-emitting device 10.

In the present embodiment, the n-side pad electrode 13 is provided on the light absorber 12 and connected to an n-type semiconductor layer in each of the elements 20. The p-side pad electrode group 14 is comprised of a plurality of p-side pad electrodes formed in a region on the mounting substrate 11 where the light absorber 12 is not formed. Each of the p-side pad electrodes is connected to each of the p-type semiconductor layers in each of the elements 20. Specifically, as illustrated in FIG. 1B, the p-side pad electrodes 14A to 14F are formed on the mounting substrate 11, and the p-side pad electrodes 14A to 14F are connected to the wirings 15A to 15F, respectively.

In the present embodiment, the semiconductor light-emitting elements 20A, 20B 20C, 20D, 20E, and 20F are connected in parallel with each other between the light absorber 12 as a cathode line and the wiring group 15 as an anode line. Conduction and non-conduction of each of the elements 20 are controlled independently of each other by applying or not applying a voltage to the respective wirings of the wiring group 15 via each of the p-side pad electrodes in the p-side pad electrode group 14. The light absorber 12 and the wiring group 15 are formed in different layers between the mounting substrate 11 and the elements 20 so as to three-dimensionally overlap with each other. Specifically, the wiring group 15 is formed on the mounting substrate 11, and the light absorber 12 is formed on the wiring group 15. Since the light absorber 12 and the wiring group 15 are three-dimensionally formed in different layers, and the light absorber 12 functions as a common cathode line connected to each of the semiconductor light-emitting elements 20, the light absorber 12 can be formed on the entire region other than the element region in the light-emitting portion EP, i.e., the entire inter-element region on the mounting substrate 11 in the present embodiment.

Figure 2A:
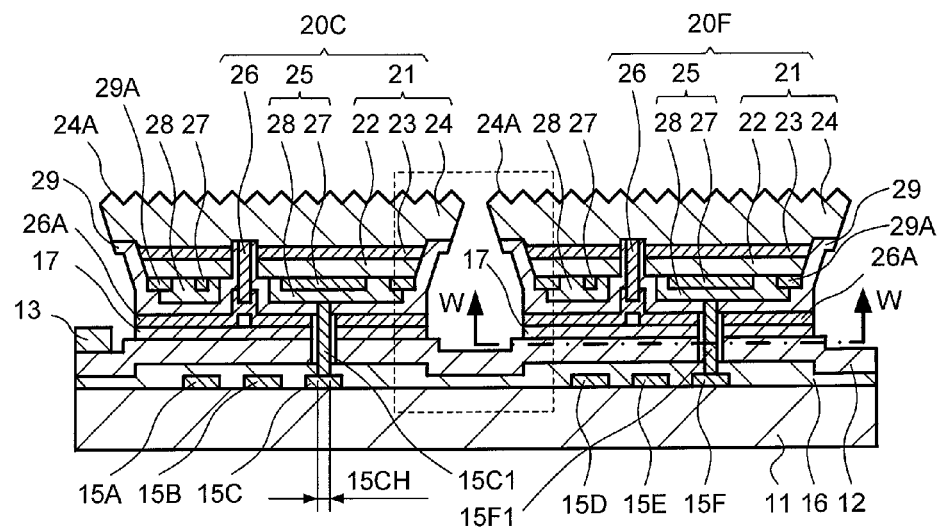
FIGS. 2A and 2B illustrate the configuration of the semiconductor light-emitting device in the first embodiment.

FIG. 2A is a cross-sectional view illustrating the detailed configuration of the semiconductor light-emitting element 20. FIG. 2A is a cross-sectional view taken along line V-V of FIG. 1B. Each of the semiconductor light-emitting elements 20 (20C and 20F in FIG. 2A) has a semiconductor structure layer 21, a p-electrode (first electrode) 25, and an n-electrode (second electrode) 26. The semiconductor structure layer 21 is configured to have a light-emitting layer 23 interposed in between a p-type semiconductor layer (first semiconductor layer) 22 and an n-type semiconductor layer (second semiconductor layer) 24.

For example, the semiconductor structure layer 21 is configured to have the p-type semiconductor layer 22 having a composition of $Al_xIn_yG_{a1-x-y}N$ ($0 \leq x \leq 1$, $0 \leq y \leq 1$), the light-emitting layer 23, and the n-type semiconductor layer 24 stacked in order on the mounting substrate 11. The n-type semiconductor layer 24 has an uneven structure surface having a plurality of protrusions 24A. The uneven structure surface of the n-type semiconductor layer 24 functions as a light extraction surface.

The p-electrode 25 includes a reflective metal layer 27 which is formed on the p-type semiconductor layer 22 and is made of metal with high reflectivity. The p-electrode 25 also includes a cap layer 28 which is formed so as to cover the entire reflective metal layer 27. For example, the reflective metal layer 27 is formed with a metal material such as Ag, Pt, Ni, Al, or Pd, or an alloy containing the same. For example, the cap layer 28 is formed with a metal material, such as Ti, W, Pt, Pd, Mo, Ru, Ir, or Au, which is less likely to migrate to other layers and which prevents migration of the reflective metal layer 27. Although not illustrated, a metal oxide film such as ITO or IZO may be formed between the p-type semiconductor layer 22 and the reflective metal layer 27 to further enhance optical reflectivity. The n-electrode 26 penetrates through the p-type semiconductor layer 22 and the light-emitting layer 23 from the surface of the p-type semiconductor layer 22, and is connected to the n-type semiconductor layer 24. For example, the n-electrode 26 is formed with a metal material such as Ti, Al, Pt, or Au.

The principal surface of the p-type semiconductor layer 22 on which the p-electrode 25 is formed is covered with an insulation film 29. In consideration of preventing migration of the material of the reflective metal layer 27 in the p-electrode 25, it is desirable to provide a sealing insulation portion 29A on the outer periphery of the p-type semiconductor layer 22. The cap layer 28 is desirably formed so as to cover part of the sealing insulation portion 29A. Since the cap layer 28 covers the region on the p-type semiconductor layer 22 in this manner, the light outgoing to the p-electrode 25 from the n-type semiconductor layer 24 and the light-emitting layer 23 is reflected by the reflective metal layer 27 and the cap layer 28 of the p-electrode 25. As a result, more light is guided to an upper side of the element, i.e., to a light extraction side. An opening extending to the n-electrode 26 is provided on the insulation film 29, and an n-side connection electrode 26A connected to the n-electrode 26 is formed in the opening.

The wiring group 15 is formed on the mounting substrate 11. Each of the wirings 15A to 15F in the wiring group 15 is wired to each of the p-electrodes 25 between the mounting substrate 11 and each of the semiconductor light-emitting elements 20A to 20F. As illustrated in FIG. 2A, the wiring group 15 is three-dimensionally formed in a layer different from the light absorber 12. The respective wirings in the wiring group 15 are formed on the same layer. An insulating layer 16 is formed so as to cover the wiring group 15. Further on top of the insulating layer 16, the light absorber 12 is formed. Thus, the light absorber 12 and the wiring group 15 are three-dimensionally formed between the mounting substrate 11 and the element 20 so as to overlap with each other via the insulating layer 16. As described above, the light absorber 12 is formed so as to cover not only the region between the mounting substrate 11 and the elements 20 but also the entire inter-element region in the light-emitting portion EP of the semiconductor light-emitting device 10.

As illustrated in FIGS. 1A, 1B, and 2A, the light absorber 12 is desirably formed not only in the inter-element region and the region between the elements 20 and the mounting substrate 11, but also a region spreading outside the outermost elements on the mounting substrate 11 so as to surround the light-emitting portion EP, i.e., the element region. Furthermore, the light absorber 12 is desirably formed so as to cover the entire region between the elements and the feed terminals (pad electrodes) on the mounting substrate 11. As a result, the light traveling in directions other than the inter-element directions out of the light emitted from the outermost semiconductor light-emitting elements can be absorbed. This makes it possible to absorb the light emitted in all directions from the outermost elements along the entire periphery.

A bonding layer 17 is formed in a region between the elements 20C and 20F on the light absorber 12 and the mounting substrate 11. When the n-side connection electrode 26A and the light absorber 12 are bonded via the bonding layer 17, the semiconductor light-emitting elements 20 are fixed to the mounting substrate 11. A contact hole 15CH extending to the wiring 15C is provided in the surface of the insulating layer 16 on the wiring 15C. A through hole is formed so as to extend from the contact hole 15CH to the p-electrode 25 through the light absorber 12, the bonding layer 17, the n-side connection electrode 26A, and the insulation film 29. In the through hole, through electrodes 15C1 and 15F1 are formed, respectively.

The through electrodes 15C1 and 15F1 are configured to have a first through electrode provided on the element 20 side and a second through electrode provided on the mounting substrate 11 side, the first through electrode and the second through electrode being bonded through a bonding portion made of a material similar to that of the junction layer 17.

In other words, the through electrodes 15C1 and 15F1 connect the wirings 15C and 15F (wiring group 15) to the respective p-electrode 25 (p-type semiconductor layer 22) of the elements 20C and 20F through the light absorber 12. Each of the wirings 15A, 15B, 15D, and 15E is connected to each of the p-electrodes 25 in the semiconductor light-emitting elements 20A, 20B, 20D, and 20E as in the case of the wirings 15C and 15F. Thus, the semiconductor light-emitting elements 20 are arranged with each other on the mounting substrate 11, and are also connected in parallel with each other.

For example, the mounting substrate 11 is made of a material, such as Si, AlN, Mo, W, or CuW, which has high heat dissipation property. The insulating layer 16, the insulation film 29, and the sealing insulation portion 29A are each made of an insulating material, such as $SiO_2$ or $Si_3N_4$ for example. The surfaces of the bonding layer 17, the n-side connection electrode 26A, and the through electrodes 15C1 and 15F1, which are to be bonded to each other, are formed of a combination of materials which are fused and bonded to each other, such as combinations of Au and Sn, Au and In, Pd and In, Cu and Sn, Ag and Sn, Ag and In, and Ni and Sn. Or the surfaces are formed of a material such as Au which is diffused and bonded to each other.

Figure 2B:
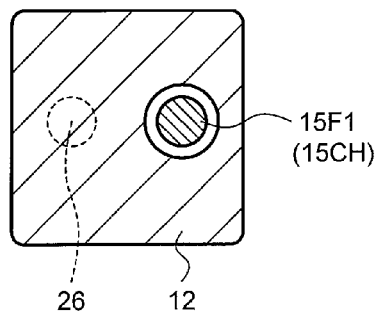

FIG. 2B is a cross-sectional view of the light absorber 12 in a formation region of the semiconductor light-emitting element 20F taken along line W-W of FIG. 2A. The configuration of the respective wirings will be described with reference to FIG. 2B. First, the light absorber 12 is formed in a layer shape between the semiconductor light-emitting elements 20 and the mounting substrate 11. The light absorber 12 is connected to the n-electrode 26 via the bonding layer 17 and the n-side connection electrode 26A. An opening is provided in a region corresponding to a position on the contact hole 15CH in the light absorber 12. In the opening, a through electrode 15F1 for the wiring 15F is formed. In this manner, the light absorber 12 is formed not only in the inter-element region of the light-emitting portion EP on the mounting substrate 11 but also in the region between the elements 20 and the mounting substrate 11 except for the region corresponding to the position on the contact hole 15CH. Such a wiring configuration can prevent an adverse effect from being exerted on formation of the elements at the time of forming the light absorber 12 on the entire inter-element region. Specifically, when the light absorber is formed on the entire inter-element region, part of the material of the light absorber is formed on the element region for manufacturing reasons. The part of the light absorber formed in the element region causes a step to be formed between the mounting substrate and the elements. If manufacturing of the device is continued with the step formed, a gap is expected to be generated in the step portion. This may cause the bonded portions to have a portion with weak bonding strength and cause distortion with respect to the elements, resulting in deterioration of a crystal state and the like at an early stage. Therefore, by forming the light absorber on the entire lower region of the elements as in the present embodiment, failures attributed to such a step can be prevented without providing an addition process.

Figure 3A:
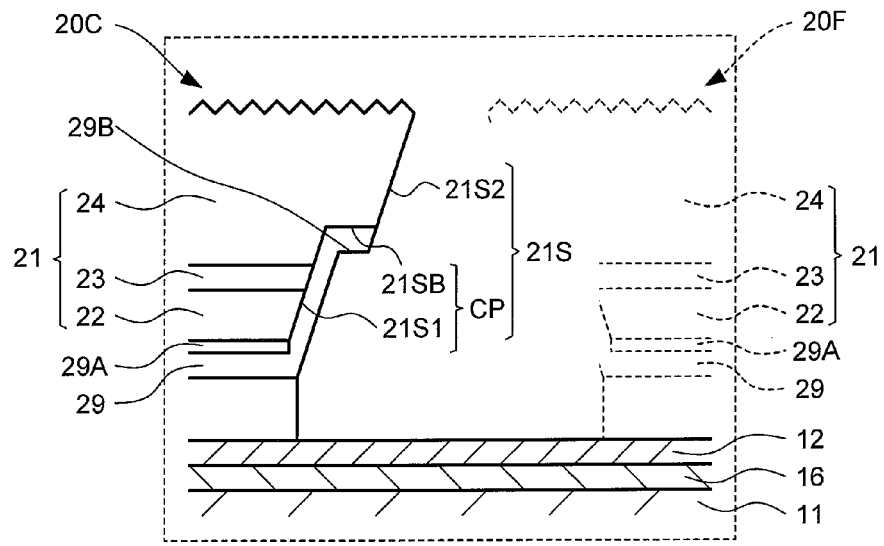
FIG. 3A is a detailed view of the side surface of an element in the semiconductor light-emitting device of the first embodiment.

FIG. 3A is a partially enlarged sectional view illustrating a portion of FIG. 2A encircled with a broken line. In FIG. 3A, for precision of the drawing, hatching is partially omitted.

Component members of the semiconductor light-emitting element 20F are illustrated with a broken line. As illustrated in FIG. 3A, a side surface 21S of the semiconductor structure layer 21 of the semiconductor light-emitting element 20C is inclined so that an interval between the semiconductor structure layer 21 of the semiconductor light-emitting element 20C and the semiconductor structure layer 21 of the adjacent semiconductor light-emitting element 20F, i.e., an interval between the adjacent semiconductor structure layers 21, expands toward the mounting substrate 11. In the present embodiment, all the side surfaces of the semiconductor structure layer 21 are inclined. This makes it possible to totally reflect the light emitted to the side surface 21S from the light-emitting layer 23 and to guide the light in the light extraction direction, i.e., toward the surface of the n-type semiconductor layer 24. Therefore, the possibility that light leaks toward an adjacent element is reduced, and the crosstalk problem can be alleviated.

In the present embodiment, the substrate used for growing the semiconductor structure layer 21 is removed, so that an extremely thin element structure is implemented. The side surface 21S of the element is exposed to the outside (air or sealing gas atmosphere). This configuration can be realized by adjusting an interval between elements and the like to prevent fluorescent material particles of a fluorescent material layer, which is formed on the elements, from entering in between the elements at the time of packaging. Since the side surface 21S of the element is exposed to the outside, media such as fluorescent material particles which tend to transmit light are not provided between the elements. Therefore, the crosstalk to the adjacent elements can further be suppressed.

A description will now be given of a more preferable configuration of the side surface of the element with reference to FIG. 3A. As illustrated in FIG. 3A, the semiconductor structure layer 21 has a side surface 21S which faces the adjacent semiconductor light-emitting element 20F. The side surface 21S has a step shape formed from a recess portion CP extending from the p-type semiconductor layer 22 to the n-type semiconductor layer 24. More specifically, the side surface 21S includes the recess portion CP made up of a recessed side surface (hereinafter referred to as a first side surface) 21S1 and a recessed bottom surface (hereinafter simply referred to as a bottom surface) 21SB. The side surface 21S also includes a second side surface 21S2 which is a portion other than the recess portion CP and which is formed outside the first side surface 21S1.

The first side surface (recessed bottom surface) 21S1 constitutes part of the side surface of the p-type semiconductor layer 22, the side surface of the light-emitting layer 23, and the side surface of the n-type semiconductor layer 24. The bottom surface (recessed bottom surface) 21SB is formed in parallel with the semiconductor structure layer 21. The second side surface 21S2 constitutes part of the side surface of the n-type semiconductor layer 24. The recess portion CP is entirely and optically exposed. Specifically, the entire surface of a portion of the semiconductor structure layer 21 exposed in the recess portion CP, i.e., all the first side surface 21S1 and bottom surface 21SB, is covered with the insulation film 29. A surface portion 29B of the insulation film 29 which faces the bottom surface 21SB of the recess portion CP is formed closer to the n-type semiconductor layer 24 side than the light-emitting layer 23. The first side surface 21S1 and the second side surface 21S2 are inclined so that an interval between the adjacent semiconductor structure layers 21 is expanded toward the mounting substrate 11. Therefore, there is a high probability that the light emitted toward the first side surface 21S1 and the second side surface 21S2 from the light-emitting layer 23 is reflected toward the light extraction surface, i.e., toward the surface of the n-type semiconductor layer 24, by the first side surface 21S1 and the second side surface 21S2.

Figure 3B:
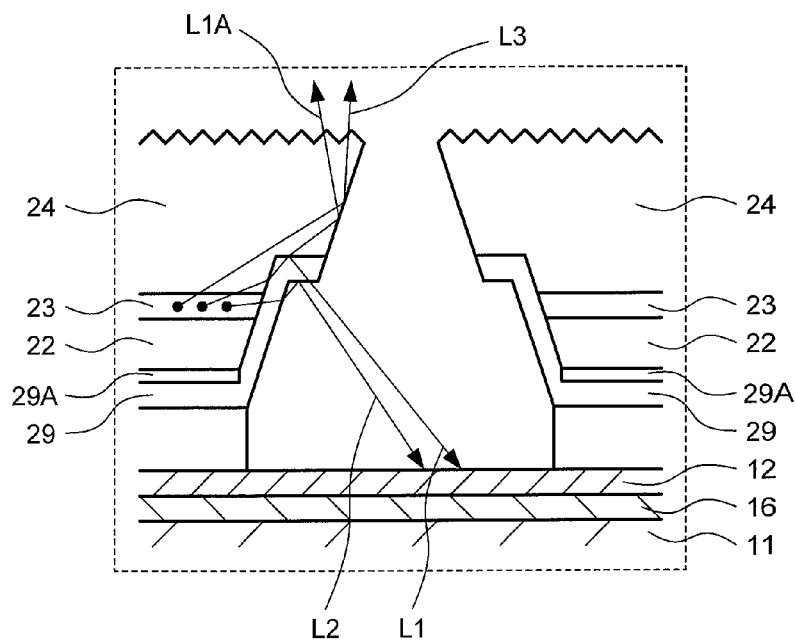
FIG. 3B is an explanatory view of routes of light in the semiconductor light-emitting device in the first embodiment.

Next, routes of light traveling in the semiconductor light-emitting device 10 will be described in detail with the light being classified into three types with reference to FIG. 3B. In FIG. 3B, hatching is partially omitted for precision of the drawing. First, light rays L1 and L2 emitted from the light-emitting layer 23 toward the first side surface 21S1 will be described. There is a high possibility that the light emitted from the light-emitting layer 23 to the first side surface 21S1 is incident on the first side surface 21S1 at a critical angle or smaller. Therefore, as is the case of the light rays L1 and L2, there is a high possibility that the light is refracted without being reflected by the first side surface 21S1 and goes to the outside of the semiconductor structure layer 21. The light ray L1 refracted by the first side surface 21S1, out of the light emitted from the light-emitting layer 23 to the first side surface 21S1, is incident on the insulation film 29 and reflected by the bottom surface 21SB, before traveling toward the mounting substrate 11. The light ray L2 emitted from the light-emitting layer 23 to the first side surface 21S1, incident on the insulation film 29, and refracted by the side surface of the insulation film 29 is reflected by a surface 29B of the insulation film 29 which faces the recessed bottom surface 21SB formed closer to the n-type semiconductor layer 24 side than the light-emitting layer 23. The light ray L2 travels toward the mounting substrate 11 in a similar manner to that of the light ray L1.

As described in the foregoing, since the side surface 21S of the semiconductor structure layer 21 in the element 20C has a step shape having the recess portion CP, the light like the light rays L1 and L2 can be guided toward the mounting substrate 11. Therefore, transmission of light to the other element 20F can be suppressed. The bottom surface 21SB of the recess portion CP is desirably flat. This is because if the bottom surface 21SB is flat, the light like the light rays L1 and L2 is less likely to pass but is more likely to be reflected toward the mounting substrate 11. Part of the light ray L1 is not reflected by the bottom surface 21SB, but is incident on the n-type semiconductor layer 24 of the semiconductor structure layer 21 again (light ray L1A). This light ray L1A travels along a route same as the route of a later-described light ray L3.

Furthermore, the light like the light rays L1 and L2 is incident on the light absorber 12 formed on the mounting substrate 11 and is thereby attenuated. The light traveling toward the mounting substrate 11 is incident on the light absorber 12. Therefore, the light absorber 12 can reliably attenuate or eliminate the light rays L1 and L2 which have a possibility of being transmitted to other semiconductor light-emitting elements 20.

Next, the light ray L3 emitted from the light-emitting layer 23 to the second side surface 21S2 is reflected by the second side surface 21S2 toward the light extraction surface, i.e., the surface of the n-type semiconductor layer 24. This is because the second side surface 21S2 is inclined. The second side surface 21S2 is inclined so that an interval between the adjacent semiconductor structure layer 21 expands toward the mounting substrate 11. Therefore, there is a higher possibility that the light is totally reflected by the second side surface 21S2. After being reflected by the second side surface 21S2, the light ray L3 is extracted to the outside together with light (not illustrated) emitted from the light-emitting layer 23 toward the surface of the n-type semiconductor layer 24, i.e., toward the light extraction surface. Furthermore, since the uneven structure surface that is the light extraction surface is excellent in light extraction efficiency, more light can be extracted to the outside.

As described in the foregoing, when the side surface of the element 20 is inclined and the side surface of the element has a step shape formed with the recess portion, it becomes possible to guide most of the light, which leaks to between the elements, to the light absorber 12. As a result, crosstalk can be reduced more. Accordingly, the effect achieved by forming the light absorber 12 on the entire inter-element region can drastically be increased.

Figure 4A:
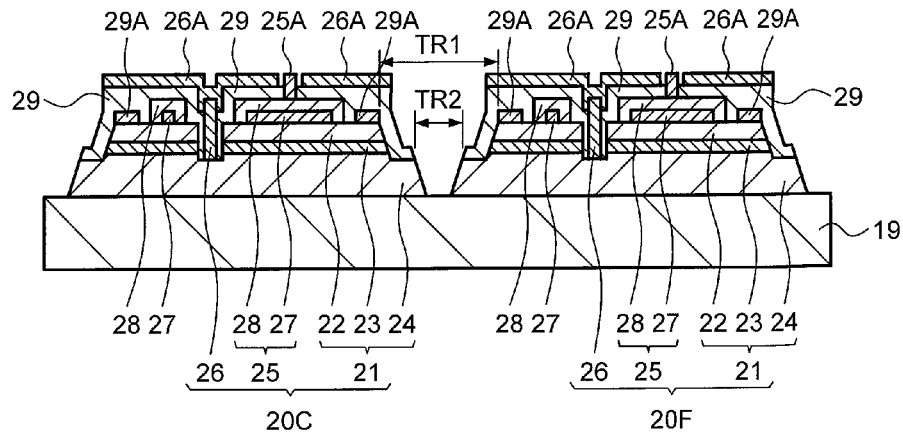
FIG. 4A to 4C illustrate a method for manufacturing the semiconductor light-emitting device of the first embodiment.
Figure 4B:
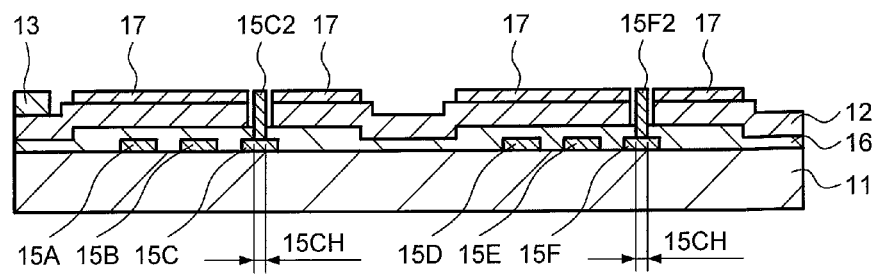
Figure 4C:
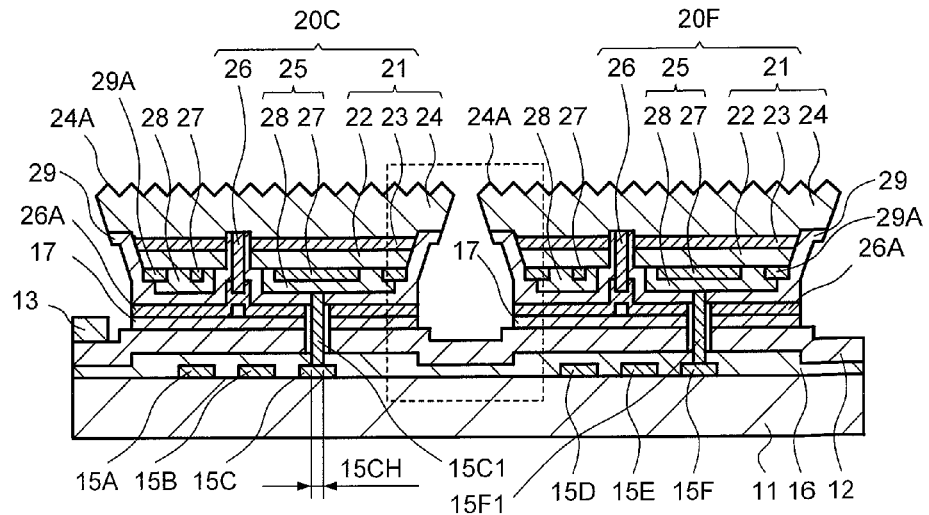

FIGS. 4A to 4C are cross-sectional views illustrating the manufacturing process of the semiconductor light-emitting device 10. One example of the method for manufacturing the semiconductor light-emitting device 10 will be described with reference to FIGS. 4A to 4C. FIG. 4A is a cross-sectional view illustrating a semiconductor wafer including the semiconductor light-emitting elements 20C and 20F immediately before being joined to the mounting substrate 11. First, a sapphire substrate was prepared as a growth substrate 19. Next, an n-type semiconductor layer, a light-emitting layer, and a p-type semiconductor layer were sequentially grown on the growth substrate 19 in this order as a semiconductor film to be used as the semiconductor structure layer 21. Next, sputtering was performed on the semiconductor film to form the reflective metal layer 27. Next, a sealing insulation portion 29A was formed on the semiconductor film, and then a cap layer 28 was formed so as to cover the entire reflective metal layer 27 and part of the sealing insulation portion 29A, by which a p-electrode 25 was formed. At that point, the p-electrode 25 was not made in some part of the surface of the semiconductor film.

Next, the semiconductor film was etched to form a through hole for the n-electrode 26 extending from the surface of a region of the semiconductor film where the p-electrode 25 (reflective metal layer 27 and cap layer 28) was not formed to the n-type semiconductor layer. At the same time, a penetrating groove TR1 used as the recess portion CP of the semiconductor structure layer 21 was also formed. At that time, etching conditions were adjusted so that the penetrating groove TR1 had a tapered form tapered toward the growth substrate 19. Next, an insulation film 29 was formed so as to cover the entire semiconductor film including the p-electrode 25 and the sealing insulation portion 29A. Next, part of the insulation film 29 formed in the through hole was removed, and the n-electrode 26 was formed in the through hole. Part of the insulation film 29 formed on the p-electrode 25 was removed to form an opening extending to the p-electrode 25. In this opening, a p-side connection electrode (first through electrode) 25A was formed. An opening extending to the n-electrode 26 was also formed in the insulation film 29, and an n-side connection electrode 26A was formed so as to be connected to the n-electrode 26 in the opening. Then, the penetrating groove TR1 was etched to form a groove portion TR2 extending to the growth substrate 19, by which second side surfaces 21S2 were formed, and the semiconductor film was divided into the semiconductor structure layers 21. At that time, etching conditions were adjusted so that the semiconductor structure layer 21 had a tapered form tapered toward the growth substrate 19. Thus, the semiconductor wafer to be joined to the mounting substrate 11 was fabricated.

FIG. 4B is a cross-sectional view illustrating the mounting substrate 11 immediately before the semiconductor wafer including the semiconductor light-emitting elements 20C and 20F is bonded. First, a mounting substrate 11 was prepared, and a wiring group 15 made up of wirings 15A, 15B, 15C, 15D, 15E, and 15F was formed on part of the mounting substrate 11. An insulating layer 16 was formed so as to cover the surface of the mounting substrate 11 including the wiring group 15. Next, the light absorber 12 was formed on the insulating layer 16. Next, an n-side pad electrode 13 was formed on the light absorber 12. A p-side pad electrode group 14 (not illustrated) was formed so as to be connected to the respective wirings. Next, sputtering was partially performed on the light absorber 12 to form a bonding layer 17. Then, contact holes 15CH penetrating from the surface of the bonding layer 17 to each of the wirings in the wiring group 15 were formed, and via electrodes (second through electrode) 15C2 and 15F2 serving as the through electrodes 15C1 and 16F1 were each formed in the contact holes 15CH. The bonding portions were formed on the through electrodes 15C1 and 15F1 with the same material as the bonding layer 17. At that time, the via electrodes 15C2 and 15F2 were made to be electrically insulated against the light absorber 12 and the bonding layer 17 in the contact holes 15CH.

Next, the semiconductor wafer was firmly attached to the mounting substrate 11 so that the bonding layer 17 was in contact with the n-side connection electrode 26A. The semiconductor wafer and the mounting substrate 11 were bonded by heating and pressurizing. At the same time, the p-side connection electrodes 25A were bonded to the via electrodes 15C2 and 15F2 with the bonding portions to form through electrodes 15C1 and 15F1. Then, the growth substrate 19 was removed by laser lift-off. Next, the surface of the exposed n-type semiconductor layer 24 was etched to form a plurality of protrusions 24A to be used as an uneven structure surface (FIG. 4C). Thus, the semiconductor light-emitting device 10 was fabricated.

Although not illustrated, the mounting substrate 11 is fixed to a packaging substrate, and the respective pad electrodes are connected to a power supply by wire bonding. Then, a fluorescent material layer is formed so as to cover the entire semiconductor light-emitting element 20, by which the semiconductor light-emitting device 10 is packaged. For example, an Au wire can be used as a bonding wire used for wire bonding.

Although the first and second semiconductor layers are respectively a p-type semiconductor layer and an n-type semiconductor layer in the above description of the present embodiment, the conductivity type of the first and second semiconductor layers may be reversed. Although the surface of the semiconductor structure layer used as the light extraction surface is an uneven structure surface constituted by a plurality of protrusions in the above description, the surface of the semiconductor structure layer may be flat. Although a plurality of light-emitting elements arranged in parallel are connected in parallel in the semiconductor light-emitting device in the above description, the plurality of light-emitting elements may be connected to each other in series, and may electrically be separated from each other. Although the side surface of the semiconductor structure layer is inclined and a step shape is formed from a recess portion in the above description, the side surface of the semiconductor structure layer may be formed at right angle to the mounting substrate, and the recess portion may be omitted. Forming the light absorber on the entire inter-element region can reliably attenuate the light, which is reflected a plurality of times inside the device and transmitted to between the elements as stray light, and can suppress transmission of the light to other elements.

In the present embodiment, the p-side pad electrode group is provided on the mounting substrate 11 in the above description. However, the p-side pad electrode may be provided at a position and in a layer other than the upper surface of the mounting substrate 11. If the p-side pad electrode is independently provided, the light absorber 12 can be provided on all the regions other than the element region on the mounting substrate 11. Therefore, the light leaking from all the elements mounted on the mounting substrate 11 can be absorbed more with a higher probability. The light absorber 12 can be provided in all the regions on the mounting substrate 11 where the p-side pad electrode is not provided. Although only one n-side pad electrode is mounted in the above description, a plurality of n-side pad electrodes may be mounted depending on the number of the elements to be mounted.

In the present embodiment, the light absorber is formed so as to cover the entire region between the adjacent semiconductor light-emitting elements among a plurality of semiconductor light-emitting elements on the mounting substrate. This sufficiently prevents the light emitted from the light-emitting layer of one semiconductor light-emitting element from going out through a region other than the light extraction surface of the one semiconductor light-emitting element. It also becomes possible to prevent the light from leaking to between the elements and being transmitted to other elements. Accordingly, when light leaks to between the elements, the intensity of the light can be lowered. Therefore, the semiconductor light-emitting device with substantially suppressed optical crosstalk can be provided. Furthermore, the light absorber is also formed in between semiconductor light-emitting elements and at least feed terminals adjacent thereto so as to cover the entire region on the mounting substrate. Accordingly, since the light emitted toward the pad electrode from the semiconductor light-emitting element placed at the outermost side is also absorbed, light distribution wherein light and dark are clearly distinguished can be provided. In the past, flexibility of design has been limited since a certain distance is provided between semiconductor light-emitting elements so as to arrange a light absorber between the elements. However, in the present embodiment, the light absorber can cover the entire region on the mounting substrate, and therefore a semiconductor light-emitting device with high design flexibility can be provided.

This application is based on a Japanese Patent application No. 2014-007001 which is hereby incorporated by reference.

What is claimed is:

1. A semiconductor light-emitting device comprising:
    a mounting substrate;
    a plurality of semiconductor light-emitting elements arranged on the mounting substrate, each of the plurality of semiconductor light-emitting elements including: a semiconductor structure layer configured to have a first semiconductor layer having a first conductivity type, a light-emitting layer, and a second semiconductor layer having a second conductivity type, which are stacked in order on the mounting substrate; a first electrode formed on the first semiconductor layer; and a second electrode extending through the first semiconductor layer and the light-emitting layer from a surface of the first semiconductor layer and being connected to the second semiconductor layer;
    a light absorber covering an entire region between adjacent ones of the plurality of semiconductor light-emitting elements on the mounting substrate; and
    a wiring group including a plurality of wirings wired to each of the first electrodes, the wiring group being provided between the mounting substrate and each of the plurality of semiconductor light-emitting elements,
    wherein:
    the light absorber has conductivity and is electrically connected to each of the second electrodes, the light absorber being provided between the mounting substrate and each of the plurality of semiconductor light-emitting elements,
    the light absorber and the wiring group are formed between the mounting substrate and each of the plurality of semiconductor light-emitting elements so as to three-dimensionally overlap with each other via an insulating layer,
    a feed terminal to each of the plurality of semiconductor light-emitting elements is provided on the mounting substrate, and
    the light absorber covers an entire region between the plurality of semiconductor light-emitting element and the feed terminal on the mounting substrate.

2. The semiconductor light-emitting device according to claim 1, wherein:
    the light absorber is provided in a layer shape between the mounting substrate and the plurality of semiconductor light-emitting elements, and
    each of the plurality of wirings is provided between the mounting substrate and the light absorber, and is connected to a corresponding one of the first electrodes through the light absorber.

3. The semiconductor light-emitting device according to claim 1, wherein:
    the semiconductor structure layer has a side surface facing a semiconductor light-emitting element adjacent thereto, the side surface having a step shape formed from a recess portion thereof, the recess portion extending from the first semiconductor layer to the second semiconductor layer, and
    the recess portion is entirely and optically exposed.

4. The semiconductor light-emitting device according to claim 3, wherein the side surface of the semiconductor structure layer is inclined so that an interval between semiconductor structure layers of adjacent ones of the plurality of semiconductor light-emitting elements expands toward the mounting substrate.

* * * * *